United States Patent [19]

Lauffer et al.

[11] Patent Number: 4,598,216
[45] Date of Patent: Jul. 1, 1986

[54] ASSIST CIRCUIT FOR A DATA BUS IN A DATA PROCESSING SYSTEM

[75] Inventors: Donald K. Lauffer, Poway; Paul M. Rostek, San Diego; Mehdi H. Sani, La Jolla, all of Calif.

[73] Assignee: NCR Corporation, Dayton, Ohio

[21] Appl. No.: 644,407

[22] Filed: Aug. 27, 1984

[51] Int. Cl.$^4$ .................. H03K 17/04; H03K 19/096
[52] U.S. Cl. .................... 307/443; 307/453; 307/475; 307/481; 307/548; 307/268
[58] Field of Search ............... 307/200 B, 443, 453, 307/475, 480–481, 354–355, 546–548, 268, 269

[56] References Cited

U.S. PATENT DOCUMENTS

| | | | |
|---|---|---|---|
| 4,404,474 | 9/1983 | Dingwall | 307/443 X |
| 4,446,382 | 5/1984 | Moore et al. | 307/443 X |
| 4,450,371 | 5/1984 | Bismarck | 307/268 X |
| 4,479,067 | 10/1984 | Fujita | 307/475 |
| 4,488,066 | 12/1984 | Shoji | 307/443 X |
| 4,496,850 | 1/1985 | Takemae et al. | 307/453 X |
| 4,498,021 | 2/1985 | Uya | 307/443 |

*Primary Examiner*—Stanley D. Miller
*Assistant Examiner*—D. R. Hudspeth
*Attorney, Agent, or Firm*—Wilbert Hawk, Jr.; Edward Dugas; Floyd A. Gonzalez

[57] ABSTRACT

A circuit for assisting transitions of a signal on a bus conductor having a sensing element connected to the bus conductor for determining if the bus conductor is in a first state or a second state, an assisting element for assisting transitions of a signal on the bus conductor between its first state and its second state responsive to electrical clock pulses, and a logic element connected to the sensing element and the assist element for enabling said assist element when the transmission of the mentioned signal is from its first state to its second state during said clock pulses, and for disabling the assisting element when the mentioned signal transition is from its second state to its first state during said clock pulses.

5 Claims, 11 Drawing Figures

ASSIST CIRCUIT FOR A DATA BUS IN A DATA PROCESSING SYSTEM

BACKGROUND OF THE INVENTION

The present invention relates generally to data transmitting buses in a data processing system, and more particularly to an assist circuit for supplying current to conductors in a data transfer bus for assisting changes in the states of the conductors in the bus.

Data processing systems contain data transfer buses such as, for instance, a data bus between a processor and a memory. The data processing system is typically timed by a clock circuit which controls the processor and the memory, allowing the processor to place data on the bus, and giving sufficient time for the data signals to stabilize before the memory reads the data from the bus for storage.

Assist circuits are known which, at or near the beginning of the processor to memory cycle, supply current to each conductor in the data bus to quickly set each conductor in the data bus to its inactive state. By use of such assist circuits, the processor does not need to supply all of the current to return the conductors in the data bus to their inactive states, but needs only to change selected conductors in the data bus to their active states which correspond to data to be transferred. However, if the prior known bus assist circuits are attempting to change the state of a conductor to its inactive state at or near the same time the processor is attempting to change the state of that same conductor to its active state, the time needed to stabilize the voltage level or state on that conductor will be lengthened.

It will be readily understood by those skilled in the art that, while the example used herein is for a data bus between a processor and a memory where the processor is controlling the state on the conductors of a data bus, the present invention is equally useful in a memory bus wherein the memory is controlling the state of the conductors on the bus, or between a processor and a peripheral device, or in a data bus between individual peripheral devices.

SUMMARY OF THE INVENTION

In the present invention, the bus assist circuit includes a pull-up network for providing current to a bus conductor, and a logic circuit which looks ahead to the conductor being pulled up for disabling the pull-up network for a conductor which is in an inactive or high state, or when the state of the conductor is changing from a high, inactive state to a low, active state.

In a preferred embodiment, a circuit for assisting transitions of a signal on a bus conductor includes a sensing element connected to the bus conductor for determining if the bus conductor is in a first state or a second state, an assisting element for assisting transitions of a signal on the bus conductor between its first state and its second state responsive to electrical clock pulses, and a logic element connected to the sensing element and the assist element for enabling said assist element when the transmission of the mentioned signal is from its first state to its second state during said clock pulses, and for disabling the assisting element when the mentioned signal transition is from its second state to its first state during said clock pulses.

It is thus an object of the present invention to provide a bus assist circuit for assisting transitions in the conductors of a data bus when the transitions are from a first active state to a second inactive state.

A further object of the present invention is to provide a bus assist circuit having logic for preventing contention between bus signal transitions to an inactive state and desired data signal transitions on said bus to an active state.

A further object of the invention is to provide a bus assist circuit which speeds up data bus transfers by shortening the time needed to set the active conductors in the data bus to their inactive states.

DESCRIPTION OF THE PREFERRED EMBODIMENT

Figure 1:
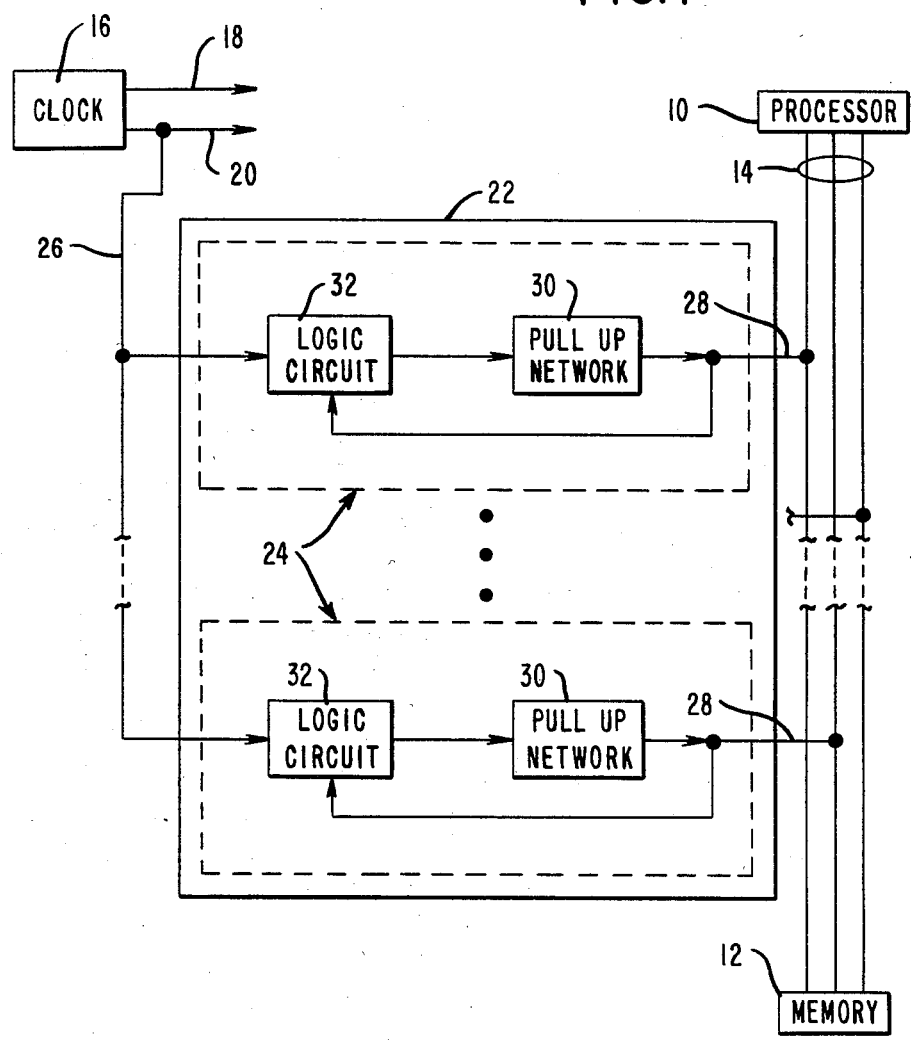
FIG. 1 is a block diagram of a simplified data processing system utilizing the bus assist circuit of the present invention.

FIG. 1 is a block diagram of a simplified data processing system having a processor 10, a memory device 12, and a multi-conductor data bus 14 connected between the processor 10 and the memory device 12. As is known, the data bus 14 includes a separate conductor for each data bit of the particular data increment for which the system is designed.

A system clock 16 is provided for controlling, among other things, data transfers between the processor 10 and the memory device 12. The clock 16 may include one or more clock outputs such as outputs 18 and 20 for controlling the data processing system, as is known. A bus assist circuit 22 contains a plurality of modules 24, one for each of the bit conductors in the bus 14. A bus assist module 24 is connected to each conductor in the data bus 14 for assisting the processor 10 and returning the separate conductors of the data bus 14 to their inactive state before a data transfer from the processor 10 to the memory 12 takes place. A common input 26 is connected to one of the clock outputs 20, and the circuit 22 has a plurality of independent outputs 28, one for each module 24 each of which is connected to one of the bit conductors in bus 14. Each bus assist module 24 includes a pull up network 30 and a logic circuit 32, to be discussed later.

Figure 2:
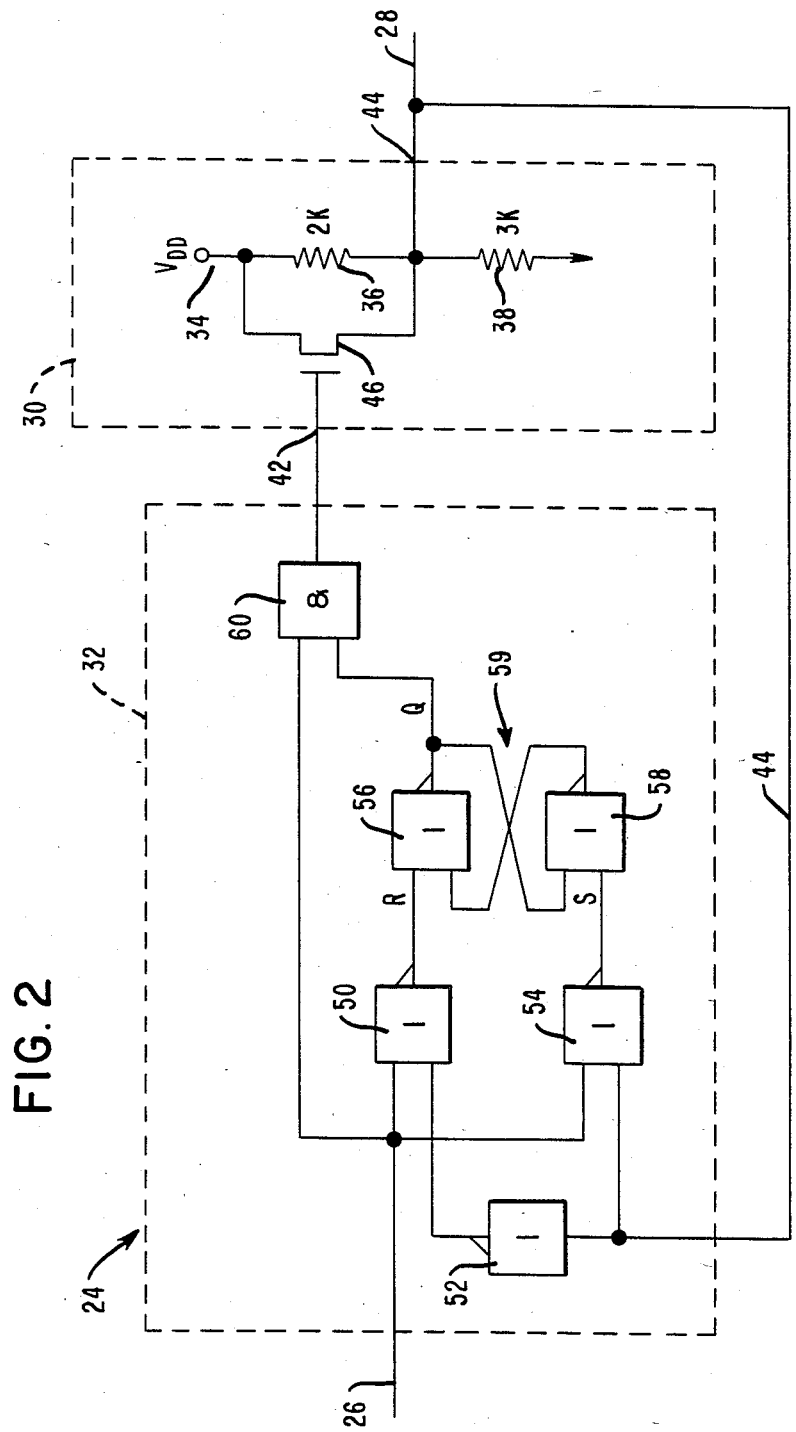
FIG. 2 is a logic diagram of the bus assist circuit of FIG. 1.

FIG. 2 is a logic diagram of the bus assist module 24 of FIG. 1, and includes a network pull-up circuit 30, and a logic circuit 32. The pull-up network 30 connected to a voltage source 34, a voltage divider circuit made up of resistors 36 and 38, and an N-channel enhancement MOS transistor 46. The input 42 of the pull-up network 30 is connected to the gate of the transistor 46, and the output 44 of the pull-up network 30 is connected to one of the bit conductors in the data bus 14 by conductor 28 as previously explained. It will thus be understood that a positive pulse at input 42 turns on the transistor 46 allowing current to flow from the voltage source 34 to the output 44 to the connected conductor 28 thus assisting in desired transitions on the bit conductors connected to conductor 28. A feedback conductor 44 is connected between output conductor 28 and the logic circuit 32 for providing a sensing means which senses the state on the output conductor 28 for controlling the logic of the circuit 32 to be described.

One input of a NOR gate 50 is connected to the common input conductor 26, and the other input of the NOR gate 50 is connected to the output of an inverter 52 which is connected to the feedback conductor 44. A second NOR gate 54 has one input connected to the common input conductor 26, and the other input connected to the feedback conductor 44.

NOR gates 56 and 58 are connected to form a set-reset flip-flop 59 having a reset terminal R connected to the output of NOR gate 50, and a set terminal S connected to the output of NOR gate 54, as shown. An AND gate 60 has one input connected to the common input conductor 26, and the other input connected to an output Q of the set-reset flip-flop 59, providing an output gate for the logic circuit 32.

In the described embodiment, a high signal on output conductor 28 is the inactive state, or a 0, on the connected bit conductor of the data bus 14 of Fig. 1. A low signal on output conductor 28, represents the active state, or a 1, on the bit conductor connected to the output conductor 28.

Figure 3:
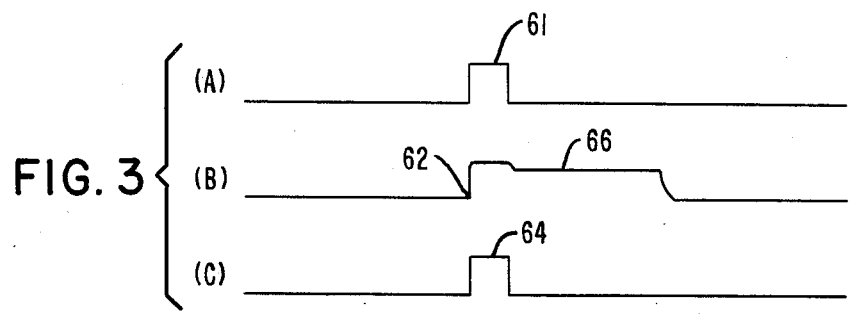
FIGS. 3A-3C illustrate waveforms for the bus assist circuit of FIG. 2 when the bus conductor is returned to the inactive state.

When the data transfer cycle begins, the clock 16 of FIG. 1 outputs a positive pulse on its output 20, which is input over conductor 26 to the input of NOR gate 50 and the AND gate 60 of the logic circuit 32 shown in FIG. 2. If the state on the output conductor 28 is low, this low is fed back over conductor 44 and inverted by inverter 52 and placed on the other input of NOR gate 50. The output of NOR gate 50 will be high, which will be applied to the reset terminal R of the flip-flop 59 formed by NOR gates 56 and 58. The high on the common input conductor 26 will be applied to one input of NOR gate 54, and the low on conductor 44 will be applied to the other input, such that the output of NOR gate 54 will go high, and in turn be applied to the set terminal S of the flip-flop 59. A low on the reset terminal R, and a high on the set terminal S will cause the Q terminal of the flip-flop to go high. Thus, the two inputs on the AND gate 60 will be high providing a high at the output of AND gate 60 which is applied to the input 42 of the pull-up network turning on transistor 46. As previously described, the turning on of transistor 46 will apply current to the output lead 28 which will assist in changing the state on the lead 28 from a low active state to a high inactive state. This condition is shown in FIGS. 3A-3C. FIG. 3A is the waveform of the signal placed on the input lead 26, FIG. 3B is the waveform of the signal on the output lead 28, and FIG. 3C shows the waveform of the input signal on pull-up network input 42. When the positive pulse 61 of FIG. 3A arrives on the common input conductor 26 of FIG. 2, and the low 62 of Fig. 3B is present on the output conductor 28 of FIG. 2, the output of AND gate 60 goes high as shown by pulse 64 of FIG. 3C for the duration of the input pulse 61. As previously explained, this turns on transistor 46 of FIG. 2 as shown at 66 of FIG. 3B.

Figure 4:
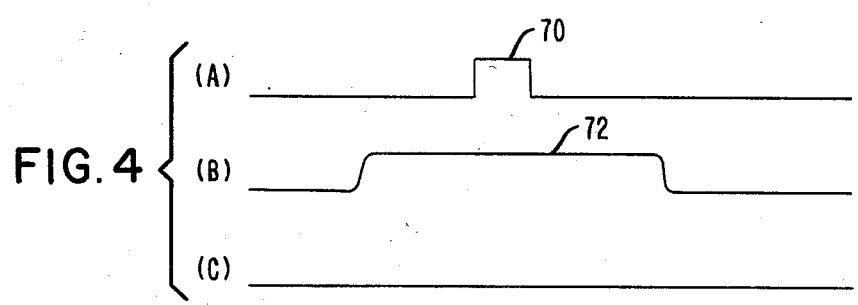
FIGS. 4A-4C illustrate waveforms for the bus assist circuit of FIG. 2 when the bus conductor remains in the inactive state.

When the state of the output conductor 28 of FIG. 2 is high, this high is inverted by inverter 52 to a low and applied to NOR gate 50 with the positive pulse on conductor 26 from the clock 16. In this case, the outputs of NOR gates 50 and 54 both go low, causing the Q output of the flip-flop 59 to remain low, thereby holding the output of AND gate 60 low. This low is applied to the gate of transistor 46, disabling transistor 46 such that the pull-up network has no effect on the state of conductor 28. This condition is shown in FIGS. 4A-4C. FIG. 4A is the waveform for the signal on the input conductor 26 and shows a clock pulse 70 which occurs when the state on the conductor 28 is high as shown at 72 of the FIG. 4B. FIG. 4C shows the waveform on the output 44 of the pull-up network which, in this case, remains low as the AND gate 60 is held in its low or off condition as previously described.

Figure 5:
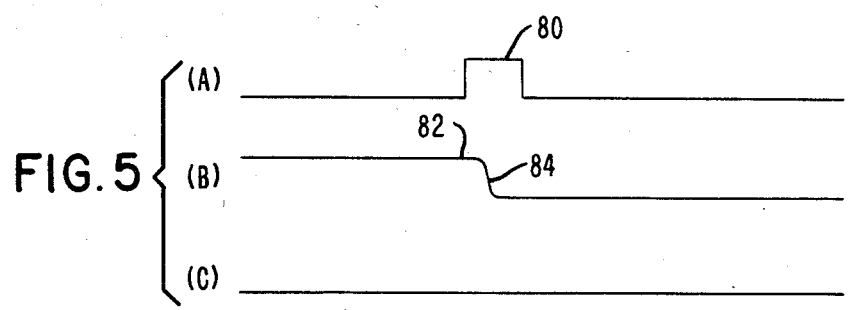
FIGS. 5A-5C illustrave waveforms for the bus assist circuit of FIG. 2 when the state of the bus conductor is changing from its inactive state to its active state.

If the state of the output conductor 28 is high, but is being changed to low or active by the processor 10 of FIG. 1, the AND gate 60 is turned off or placed in its low condition as discussed in connection with FIGS. 4A-4C. The AND gate 60 remains off, holding the transistor 46 off for a sufficient length of time to allow the processor 10 of FIG. 1 to change the state on output conductor 28 of FIG. 2 to its low or active condition. This prevents any contention between the output of the pull-up network 30 with the output of the processor 10, thereby shortening the time necessary to change the state of the output conductor 28 in this case from its high or inactive state to its low or active state. This condition is shown in FIG. 5A-5C, wherein the pulse 80 on FIG. 5A represents a positive pulse from the clock 16 of Fig. 1, and the state on conductor 28 is high as shown at 82 of FIG. 5B. The signal on the input 42 remains low as shown in FIG. 5C throughout the duration of the positive pulse 80. The transition 84 from the high state to the low state is thus controlled by the output of processor 10 of FIG. 1, and is not interfered with by the pull-up network 30, as previously explained.

The NOR gates 50, 54, 56 and 58 of the logic circuit 32 may be provided by a 74F02 chip available from Fairchild Camera and Instrument Corporation of Mountain View, California, and the inverter 52 and the AND gate 60 may be provided by the proper connections to a 74S38 chip available from Texas Instruments Corporation of Ricardson, Tex., as is known. The pull-up network 30 may be formed by a conventional bus assist chip, or may be formed by an N-channel enhancement MOS transistor available from Siliconix of Santa Clara, Calif., under the designation of VQ1001. The voltage divider network may be formed by a 2 K ohm resistor 36 and a 3 K ohm resistor 38.

While a bus assist circuit has been shown being formed from discrete components, it will be understood that an integrated circuit chip may be fabricated for the pull-up network 30, the logic circuit 32, or both together, using standard design and fabrication techniques.

A bus assist circuit for use in a data processing system having a data transfer bus has been described which assists transitions of the states of separate bit conductors in the data transmission bus from an active state to an inactive state, but which is disabled and allows transitions from the inactive state to the active state without contention from the bus assist circuit. It will be understood that data transmission buses other than one from a processor to a memory device may be used, or that data bit states having a low for an inactive state and a high for an active state may be substituted by those skilled in the art. The described bus assist circuit, and its components are exemplary only and may be replaced by equivalents by those skilled in the art, which equivalents are intended to be covered by the attached claims.

What is claimed is:

1. In a circuit for assisting transitions of a signal on a bus conductor, the improvement comprising;

sensing means connected to the bus conductor for determining if said bus conductor is in a first state or a second state;

assist means for assisting transitions of a signal on said bus conductor between said first state and said second state responsive to electrical clock pulses; and logic means connected to said sensing means and said assist means for enabling said assist means when said signal transition of said signal is from said first state to said second state during said clock pulses, and for disabling said assist means when said signal transition is from said second state to said first state during said clock pulses.

2. The circuit of claim 1 wherein said assist means comprises a current source, and a switch means for switching said current source onto said bus conductor when in a closed condition, and for breaking current flow from said current source to said bus conductor when in an open condition; said switch means having a control input connected to said logic means for switching said switch means to its closed condition when said logic means enables said assist means, and for switching said switch means to its open condition when said logic means disables said assist means.

3. The circuit of claim 2 wherein said sensing means comprises a feedback conductor connected between said bus conductor and said logic means; and said logic means comprises a clock input for receiving said clock pulses, and a two state circuit having an output connected to the control input of said switch means, a first input connected to said clock input, and a second input connected to said feedback conductor; said two-state circuit having a first enabling condition on its output when the bus conductor is at said first state at the start of a clock pulse on said clock input, and having a second disabling condition on its output when the bus conductor is at said second state at the start of a clock pulse on said clock input.

4. The circuit of claim 3 wherein said two-state circuit comprises:

an inverter having an input connected to the logic means end of said feedback conductor, and an output;

a first NOR gate having a first input connected to said clock input, a second input connected to the output of said inverter, and an output;

a second NOR gate having a first input connected to said clock input, a second input connected to the logic means end of said feedback conductor, and an output;

a set-reset type flip-flop having a reset input connected to the output of said first NOR gate, a set input connected to the output of said second NOR gate, and a Q output; and an AND gate having a first input connected to said clock input, a second input connected to said Q output of said set-reset type flip-flop, and an output connected to the output of said two-state circuit.

5. The circuit of claims 1, 2, 3 or 4 wherein said logic means enables said assist means when the first state of said bus conductor is a low, and said logic means disables said assist means when the second state of said bus conductor is a high.

* * * * *